United States Patent
Kang

(10) Patent No.: US 10,400,988 B2
(45) Date of Patent: Sep. 3, 2019

(54) LIGHT EMITTING MODULE AND LIGHT EMITTING APPARATUS

(71) Applicant: LG INNOTEK CO., LTD., Seoul (KR)

(72) Inventor: Lee Im Kang, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 186 days.

(21) Appl. No.: 14/959,038

(22) Filed: Dec. 4, 2015

(65) Prior Publication Data

US 2016/0161086 A1 Jun. 9, 2016

(30) Foreign Application Priority Data

Dec. 8, 2014 (KR) .................... 10-2014-0174739

(51) Int. Cl.
| | | |
|---|---|---|
| F21V 7/00 | (2006.01) | |
| F21V 7/04 | (2006.01) | |
| G02B 19/00 | (2006.01) | |
| H01L 33/60 | (2010.01) | |
| F21Y 115/10 | (2016.01) | |

(52) U.S. Cl.
CPC ............ *F21V 7/0066* (2013.01); *F21V 7/04* (2013.01); *G02B 19/0061* (2013.01); *G02B 19/0066* (2013.01); *H01L 33/60* (2013.01); *F21Y 2115/10* (2016.08)

(58) Field of Classification Search
CPC ..... F21V 7/0066; F21V 7/04; G02B 19/0061; G02B 19/0066; H01L 33/60
See application file for complete search history.

(56) References Cited

U.S. PATENT DOCUMENTS

| | | | |
|---|---|---|---|
| 2002/0100969 A1* | 8/2002 | Farquhar | H01L 21/563 257/717 |
| 2006/0102918 A1 | 5/2006 | Su et al. | |
| 2009/0032595 A1 | 2/2009 | Oliva et al. | |
| 2009/0134408 A1 | 5/2009 | Park et al. | |
| 2009/0244903 A1 | 10/2009 | Wong et al. | |
| 2011/0186894 A1 | 8/2011 | Kim | |
| 2012/0275186 A1* | 11/2012 | Min | H01L 25/167 362/607 |

(Continued)

FOREIGN PATENT DOCUMENTS

| | | |
|---|---|---|
| JP | 2009-266516 A | 11/2009 |
| JP | 2010-129655 | 6/2010 |
| TW | 200618326 | 6/2006 |

OTHER PUBLICATIONS

European Search Report dated Jun. 9, 2016 issued in Application No. 15197446.6.

(Continued)

*Primary Examiner* — Sharon E Payne
(74) *Attorney, Agent, or Firm* — KED & Associates, LLP

(57) ABSTRACT

A light emitting module may include a board, at least one light source unit provided on the board, an optical member provided on the at least one light source unit, and a reflection unit provided between the board and the optical member in an inclined state beside at least one light source unit. The reflection unit may be provided closer to the optical member than to the board and may include a pattern having lower reflectance than other constructions of the light emitting module.

20 Claims, 13 Drawing Sheets

(56) References Cited

U.S. PATENT DOCUMENTS

| | | | |
|---|---|---|---|
| 2013/0121026 A1* | 5/2013 | Nakai | F21V 21/00 362/609 |
| 2013/0163241 A1* | 6/2013 | Funakubo | F21V 21/00 362/235 |
| 2013/0307003 A1 | 11/2013 | Park et al. | |
| 2014/0204591 A1* | 7/2014 | Kim | G02B 19/0061 362/311.02 |
| 2014/0307421 A1 | 10/2014 | Lee et al. | |

OTHER PUBLICATIONS

European Search Report dated Jun. 13, 2016 issued in Application No. 15 197 446.6.
Chinese Office Action (with English translation) dated Mar. 19, 2019 issued in CN Application No. 201510898110.9.

\* cited by examiner

LIGHT EMITTING MODULE AND LIGHT EMITTING APPARATUS

CROSS REFERENCE TO RELATED APPLICATION

This application claims priority under 35 U.S.C. § 119 to Korean Application No. 10-2014-0174739 filed on Dec. 8, 2014, whose entire disclosure is incorporated herein by reference.

BACKGROUND

1. Field

Embodiments relate to a light emitting module and a light emitting apparatus.

2. Background

A light emitting diode (LED) is a kind of semiconductor device that converts electricity into light, for example, infrared light, for signal transmission and reception or that is used as a light source, using the characteristics of a compound semiconductor.

Group III-V nitride semiconductors have been used as core materials for light emitting devices, such as, for example, light emitting diodes (LEDs) or laser diodes (LDs), due to the physical and chemical properties thereof.

LEDs are eco-friendly because they do not include environmentally harmful materials, such as mercury (Hg) used in conventional lighting apparatuses, e.g., incandescent lamps and fluorescent lamps. In addition, LEDs have long lifespans and low power consumption. For these reasons, LEDs have replaced conventional light sources.

Liquid crystal displays (LCDs) and plasma display panels (PDPs) are typically known as large-sized display apparatuses. Unlike the PDP, which is self-emissive, the LCD needs a backlight unit as the LCD is not self-emissive.

A backlight used in the LCD may include a light emitting device, a lens located on the light emitting device, and a diffusion plate located on the lens. Based on the position of a light source, the backlight unit may be classified as an edge-type backlight unit or a direct-type backlight unit.

In the edge-type backlight unit, the light source is located at the left and right sides and/or the upper and lower sides of an LCD panel, and light may be uniformly dispersed over the entire surface of the LCD panel using a light guide plate. As a result, light uniformity may be high, and the thickness of the LCD panel may be remarkably reduced.

In the direct-type backlight unit generally applied to display apparatuses larger than 20 inches, a plurality of light sources is located under a panel. The direct type backlight unit may exhibit higher light efficiency than the edge-type backlight unit. For this reason, the direct-type backlight unit may be mainly used for large-sized display apparatuses in which high luminance is critical. In addition, in the direct-type backlight unit, the size of a bezel may be more easily reduced than in the edge-type backlight unit.

In the direct-type backlight unit, light emitted from the light emitting device is spread using the lens and then exits through the diffusion plate. If a reflection plate is positioned to reflect light exiting from the lateral side of the light emitting device and to emit the reflected light to the upper side of the light emitting device, the brightness of light exiting from the edge of the diffusion plate is different from the brightness of light exiting from the center of the diffusion plate as a beam angle of light emitted from the light emitting device through the lens is different from an angle of inclination of the reflection plate. Thus, light uniformity may be reduced.

BRIEF DESCRIPTION OF THE DRAWINGS

The embodiments will be described in detail with reference to the following drawings in which like reference numerals refer to like elements wherein.

DETAILED DESCRIPTION

Figure 1:
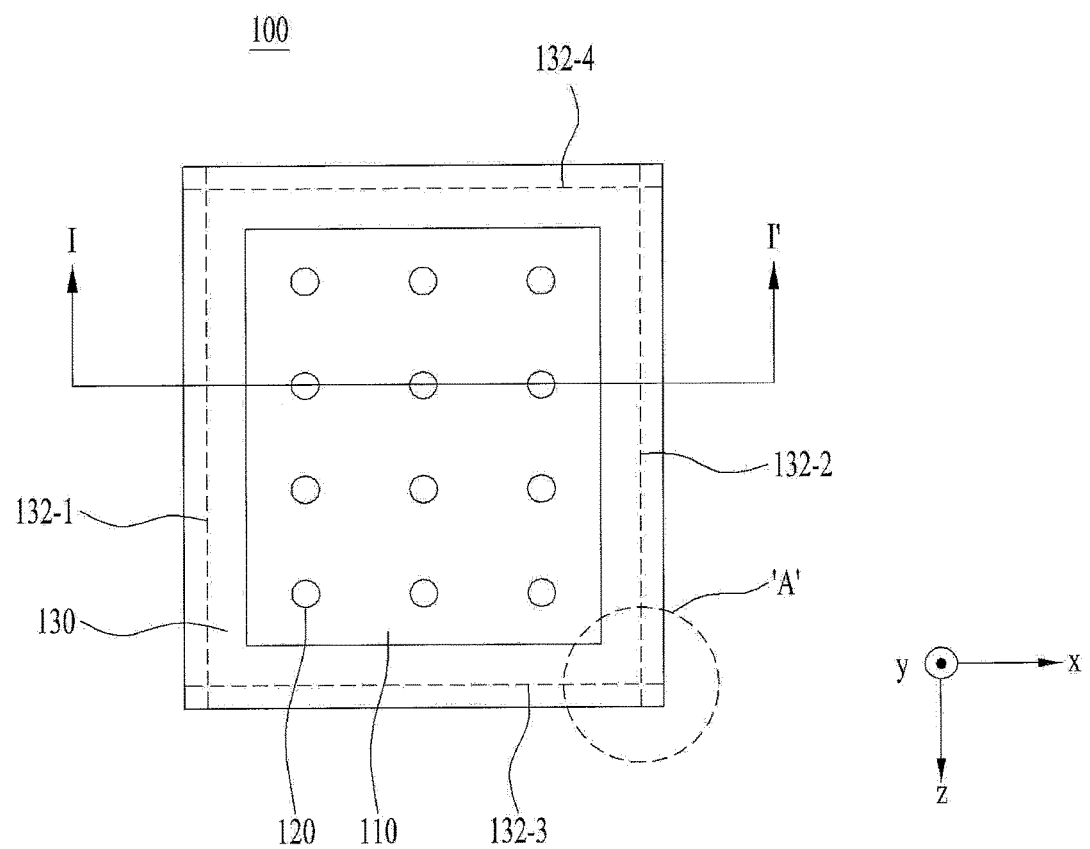
FIG. 1 is a plan view of an optical module according to an embodiment.
Figure 2:
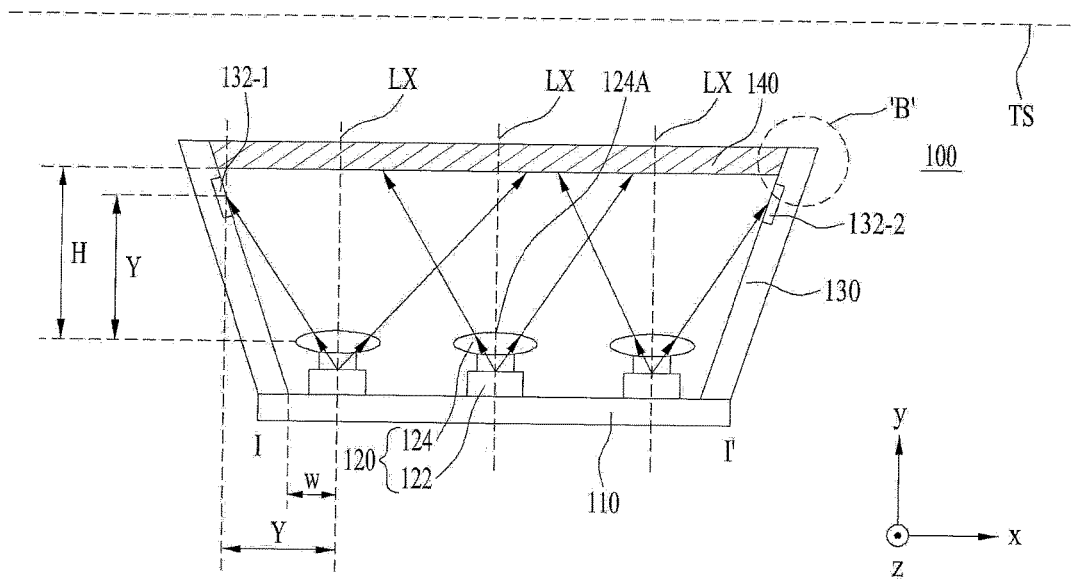
FIG. 2 is a sectional view of the optical module taken along line I-I' of FIG. 1.

FIG. 1 is a plan view of an optical module 100 according to an embodiment, and FIG. 2 is a sectional view of the optical module 100 taken along line I-I' of FIG. 1. The optical module 100 according to the embodiment may include a board 110, a plurality of light source units 120, a reflection unit 130, and an optical member 140. For the convenience of description, the optical member 140 is not illustrated in FIG. 1.

The light source units 120 may be located or provided on the board 110. An electrode pattern for connecting each light source unit 120 with an adaptor for supplying electric power may be formed on the board 110. For example, an electrode pattern for connecting each light source unit 120 with a corresponding adaptor may be formed on the upper surface of the board 110.

The board 110 may be a printed circuit board (PCB), made of, e.g., polyethylene terephthalate (PET), glass, polycarbonate (PC), or silicon (Si). The board 110 may be formed to have a film shape. In addition, a single-layer PCB, a multiple-layer PCB, a ceramic board, or a metal core PCB may be selectively used as the board 110.

The upper surface of the board 110 may be coated with a reflective material for reflecting light that is emitted from the light source unit 120 and returns back to the optical member 140 without exiting.

In FIG. 1, twelve light source units 120 are shown, but the disclosure is not limited thereto. That is, in another embodiment, the optical module 100 may include more than or less than twelve light source units 120. In FIGS. 1 and 2, the light source units 120 are shown as being spaced apart from each other by the same distance. However, the disclosure is not limited thereto. That is, in another embodiment, the light source units 120 may be spaced apart from each other by different distances.

Each light source unit 120 may include a light source 122 and a lens 124. The light source 122 may be located on the board 110. The light source 122 may be a light emitting diode (LED) chip. The LED chip may be a blue LED chip or an ultraviolet LED chip. Alternatively, the LED chip may be at least one selected from a red LED chip, a green LED chip, a blue LED chip, a yellow green LED chip, and a white LED chip or a combination thereof.

A white LED may be created, for example, by applying a yellow phosphor to a blue LED, by simultaneously applying a red phosphor and a green phosphor to a blue LED, or by simultaneously applying a yellow phosphor, a red phosphor, and a green phosphor to a blue LED.

The light source 122 may be located to overlap the lens 124 in a direction of optical axis LX (e.g. a y-axis direction). However, the disclosure is not limited to the specific position of the light source 122. The light source 122 may be a top view type light emitting diode. Alternatively, the light source 122 may be a side view type light emitting diode.

The light emitting diode may have a vertical bonding structure, a horizontal bonding structure, or flip-chip bonding structure. The light emitting diode may emit light having various wavelength bands.

The lens 124 may be located on the light source 122 for refracting and transmitting light emitted from the light source 122. For example, the lens 124 may have at least one selected from planar or sectional shapes that may be symmetric with respect to the optical axis LX.

The lens 124 may be made of a transparent material. For example, the lens 124 may be made of a material including, e.g., silicon, polycarbonate (PC), acrylic resin such as polymethyl methacrylate (PMMA), or glass. In addition, the lens 124 may have various shapes, such as, e.g., a spherical shape and an aspherical shape, but the disclosure is not limited thereto.

In FIG. 2, one lens 124 is shown as being located on one light source 122. However, the disclosure is not limited thereto. That is, in another embodiment, one lens 124 may be located on a plurality of light sources 122, or a plurality of lenses 124 may be located on one light source 122.

The optical member 140 may be located on the light source units 120 for diffusing light that is emitted from the light source units 120 or reflected by the reflection unit 130. In order to improve a diffusion effect, a concave and convex pattern may be formed on the upper surface of the optical member 140.

The optical member 140 may be formed to have a single layer or a plurality of layers. The concave and convex pattern may be formed on an uppermost layer or any one of the layers of the optical member 140. The concave and convex pattern may be formed to have a stripe shape disposed according to the light source units 120.

The optical member 140 may include at least one sheet. For example, the optical member 140 may selectively include a diffusion sheet, a prism sheet, and a luminance enhancement sheet. The diffusion sheet may serve to diffuse light emitted from the light source units 120. The prism sheet may serve to guide the diffused light to a light emitting area. The luminance enhancement sheet may serve to enhance luminance.

In FIGS. 1 and 2, an air layer may be located between the optical member 140 and the light source units 120. In another embodiment, a light guide plate may be located between the optical member 140 and the light source units 120. The light guide plate may serve to guide light emitted from the light source units 120. For example, the light guide plate may be made of an acrylic resin such as polymethyl methacrylate (PMMA), polyethylene terephthalate (PET), cycloolefin copolymer (COC), polyethylene naphthalate (PEN), polycarbonate (PC), polystyrene (PS), or methacrylate styrene (MS).

The reflection unit 130 may be located between the board 110 and the optical member 140 in an inclined state beside the light source units 120. In order to improve the uniformity in light emitted from the light source units 120, the reflection unit 130 may serve to reflect the light emitted from the light source units 120 toward the optical member 140. The reflection unit 130 may have various shapes, for example, a sheet shape. The reflection unit 130 may be made of at least one of a metal or a metal oxide. For example, the reflection unit 130 may be made of a metal, e.g., aluminum (Al), silver (Ag), or gold (Au), exhibiting high reflectance or a metal oxide, e.g., titanium dioxide ($TiO_2$), exhibiting high reflectance.

According to the embodiment, the reflection unit 130 may include patterns 132-1 to 132-4. The patterns 132-1 to 132-4 may be formed so as to be closer to the optical member 140 than to the board 110.

Figure 4:
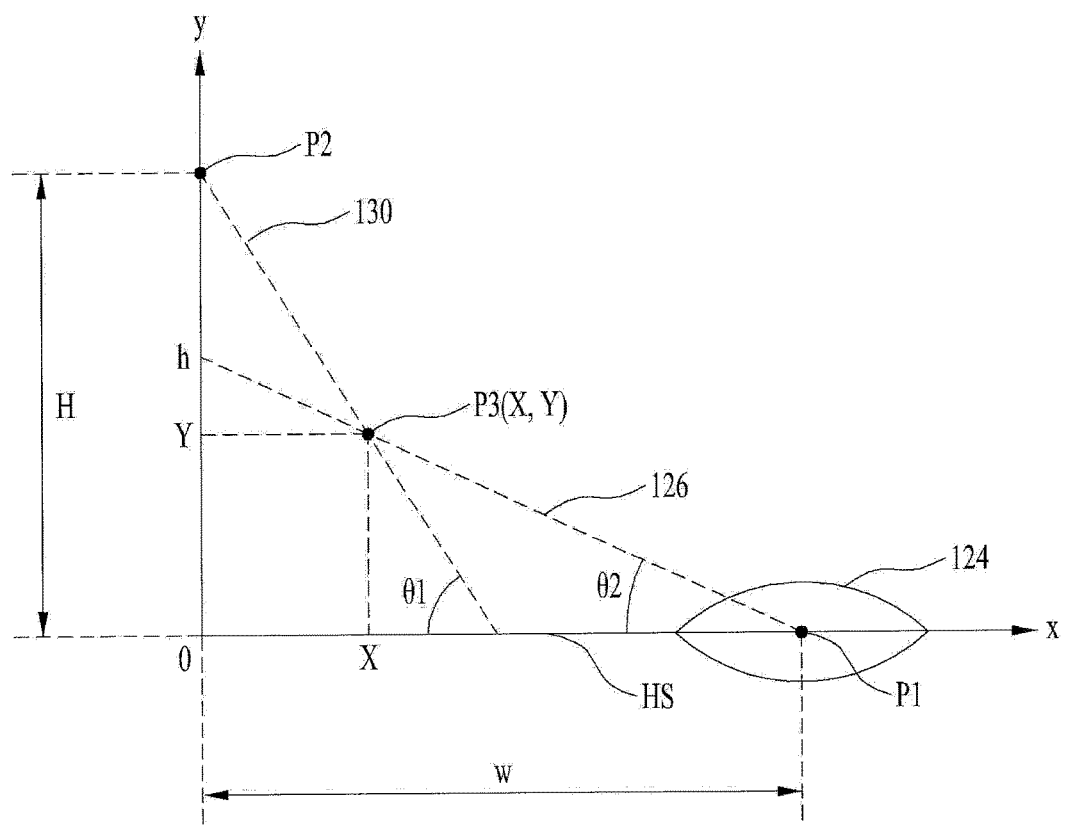
FIG. 4 is a view of a reflection unit and a lens shown in FIGS. 1 and 2.

Depending on a horizontal surface in a first direction or an x-axis direction perpendicular to the optical axis LX or an y-axis direction, an angle of inclination $\theta1$ as shown in FIG. 4 of the reflection unit 130 may be identical to or different from a beam angle of light emitted from the light source units 120. If the angle of inclination of the reflection unit 130 is identical to the beam angle of light, the patterns 132-1 to 132-4 of the reflection unit 130 may be omitted. If the angle of inclination of the reflection unit 130 is different from the beam angle of light, the patterns 132-1 to 132-4 may not be omitted.

As shown in FIG. 1, the patterns 132-1 to 132-4 may be configured to have a band shape, but the disclosure is not limited thereto. The patterns 132-1 to 132-4 may be located along at least one selected from a major axis and a minor axis of the reflection unit 130. As shown in FIG. 1, much more light source units 120 may be arranged along the z-axis than the x-axis. Thus, the z-axis, along which much more light source units 120 may be arranged than the x-axis, may correspond to the major axis of the reflection unit 130, and the x-axis, along which much less light source units 120 may be arranged than the z-axis, may correspond to the minor axis of the reflection unit 130. In this case, as shown in FIG. 1, the patterns 132-1 to 132-4 may be arranged along both the major axis or the z-axis and the minor axis or the x-axis of the reflection unit 130.

Alternatively, unlike what is shown in FIG. 1, the patterns 132-1 and 132-2 may be arranged along the major axis or the z-axis of the reflection unit 130, and the patterns 132-3 and 132-4 may be arranged along the minor axis or the x-axis of the reflection unit 130.

In addition, the patterns 132-1 to 132-4 may be located higher than the upper surfaces of the light source units 120. That is, referring to FIG. 2, the patterns 132-1 to 132-4 may be located higher than the upper surfaces 124A of the light source units 120 in the direction of optical axis LX, or the y-axis direction. However, the disclosure is not limited thereto.

Referring to FIG. 4, the patterns 132-1 to 132-4 may have at least one selected from between a planar shape and a sectional shape that are symmetric with respect to the light source units 120. That is, referring to FIG. 1, the patterns 132-1 and 132-2 may be arranged symmetrically while three light source units 120 are located between the patterns 132-1 and 132-2 in the minor axis direction of the reflection unit 130, or the x-axis direction. The patterns 132-3 and 132-4 may be arranged symmetrically while four light source units 120 are located between the patterns 132-3 and 132-4 in the major axis direction of the reflection unit 130, or the z-axis direction.

In another embodiment, the patterns 132-1 and 132-2 may be arranged asymmetrically in the x-axis direction, and patterns 132-3 and 132-4 may be arranged asymmetrically in the z-axis direction. Thus, the patterns 132-1 to 132-4 may be arranged symmetrically or asymmetrically in a direction intersecting the optical axis LX or at least one selected from between the x-axis direction and the z-axis direction.

Figure 3A:
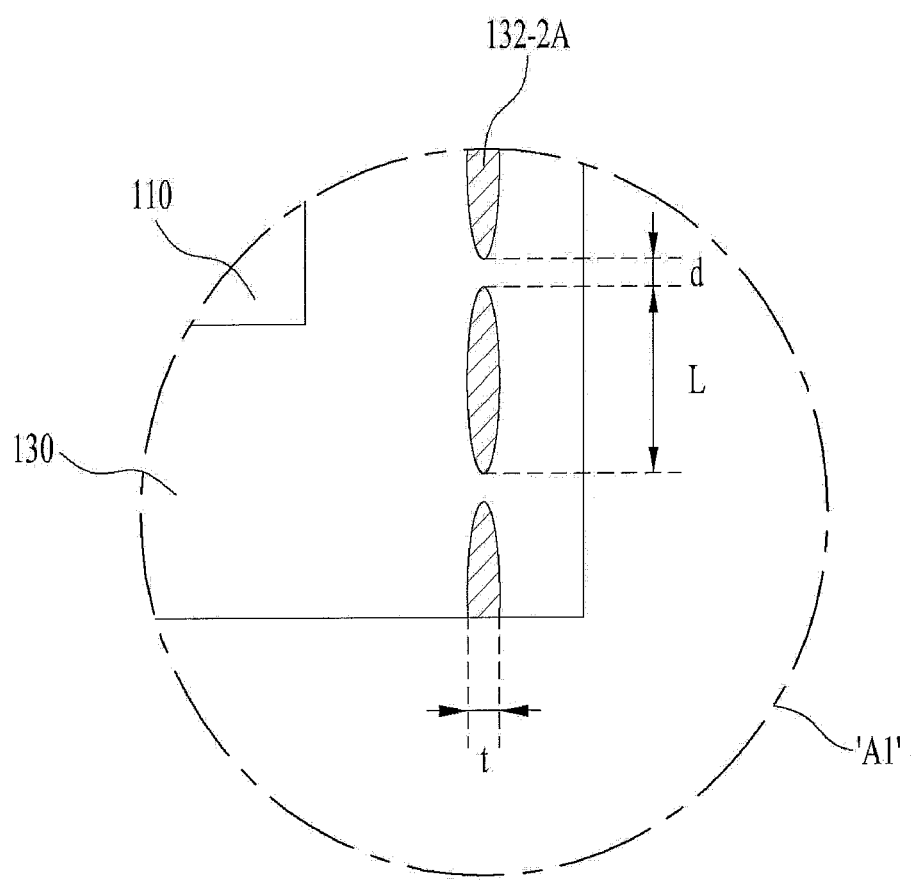
FIGS. 3A to 3C are partially enlarged views showing embodiments of part A' shown in FIG. 1.
Figure 3B:
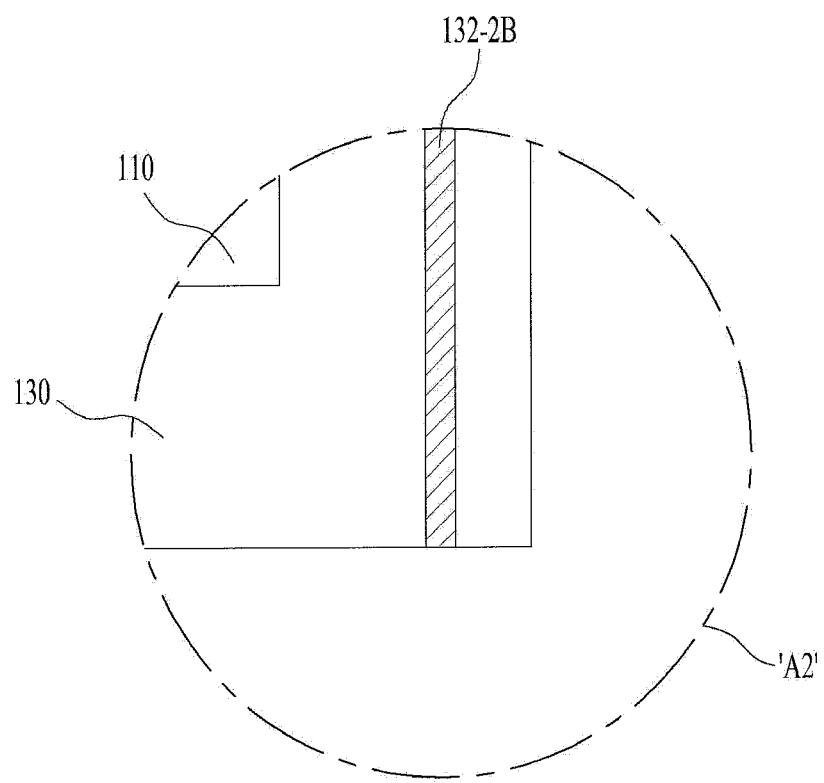
Figure 3C:
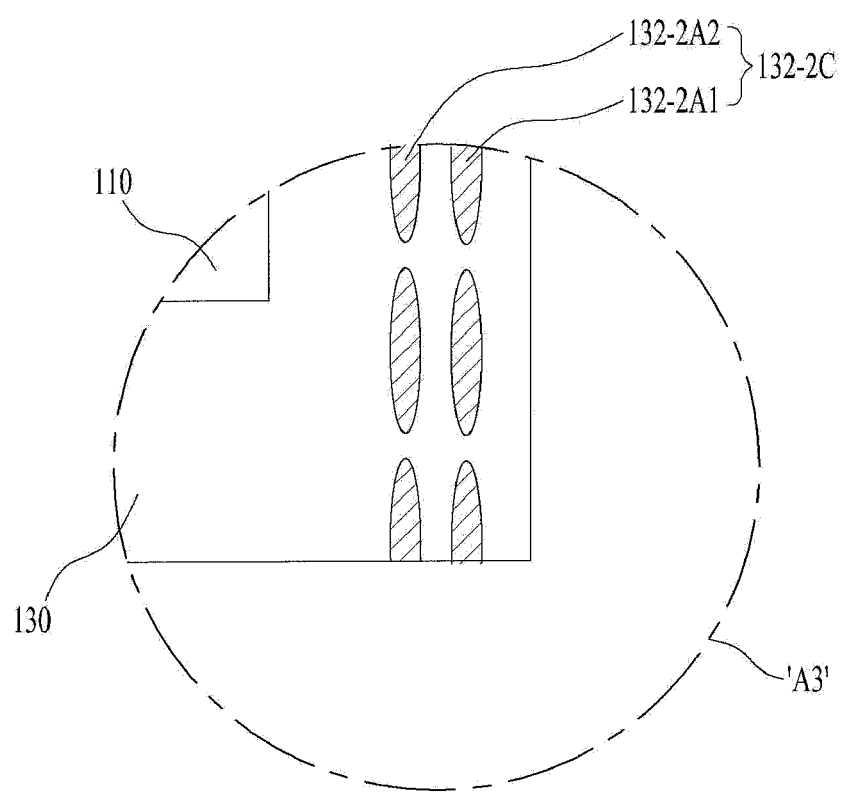

FIGS. 3A to 3C are partially enlarged views of embodiments A1, A2, and A3 of part 'A' shown in FIG. 1. As shown in FIG. 3A, the reflection unit 130 may have a pattern including a plurality of blind holes 132-2A spaced apart from each other in a dotted-line shape. In another embodiment, as shown in FIG. 3B, the reflection unit 130 may have a pattern including a blind hole 132-2B extending in a solid-line shape.

As shown in FIG. 3C, the reflection unit 130 may have a pattern 132-2C including a plurality of blind holes 132-2A1 and 132-2A2 spaced apart from each other in a dotted-line shape. In a further embodiment, as shown in FIG. 3C, the pattern 132-2C may be configured to have a plurality of bands, unlike what is shown in FIGS. 3A and 3B where the patterns 132-2A and 132-2B are configured to have a single band. As shown in FIG. 3C, the pattern 132-2C may have two bands 132-2A1 and 132-2A2, which may be parallel to each other, but the disclosure is not limited thereto. That is, in another embodiment, each of the patterns 132-1 to 132-4 may have three or more bands that may be parallel to one another.

The blind holes 132-2A, 132-2B, and 132-2C may be formed by punching the reflection unit 130, but the disclosure is not limited thereto.

Referring to FIG. 3A, if the pattern 132-2A includes a plurality of blind holes spaced apart from each other in a dotted-line shape, a distance d between the blind holes 132-2A may be less than a length L of each of the blind holes 132-2A. The distance d may indicate the distance between the blind holes 132-2A in the z-axis direction, and the length L may indicate the length of each of the blind holes 132-2A arranged in the z-axis direction.

The holes 132-2A, 132-2B, and 132-2C shown in FIGS. 3A to 3C may be blind holes, as shown in FIG. 2. However, the disclosure is not limited thereto. In another embodiment, the holes 132-2A, 132-2B, and 132-2C, which form the patterns 132-1 to 132-4, may be through holes.

FIG. 4 is a view of the reflection unit 130 and the lens 124 shown in FIGS. 1 and 2. In FIG. 4, x and y indicate the x-axis and the y-axis, respectively, shown in FIGS. 1 and 2.

In FIG. 4, the reflection unit 130 may be defined as a function (y') represented by Equation 1.

$$y'=-\tan(\theta 1)x+H \quad \text{[Equation 1]}$$

In Equation 1, θ1 indicates an angle of inclination at which the reflection unit 130 may be inclined with respect to a horizontal surface HS in a first direction or an x-axis direction passing through the light source unit 120 or a center P1 of the lens 124, and H indicates the distance between the light source unit 120 or the center P1 of the lens 124 and a contact point P2 in a second direction or a y-axis direction parallel to the optical axis LX. The contact point P2 may indicate a point at which the optical member 140 may meet the top of the reflection unit 130. Alternatively, the contact point P2 may indicate the upper end of the reflection unit 130.

In addition, light 126 exiting from the light source unit 120 or the center P1 of the lens 124 may be defined as a function (y'') represented by Equation 2.

$$y''=-\tan(\theta 2)x+\tan(\theta 2)\times w \quad \text{[Equation 2]}$$

In Equation 2, θ2 indicates an angle of inclination at which light 126 exiting from the light source unit 120 or the center P1 of the lens 124 may be inclined with respect to the horizontal surface HS, w indicates the distance between the light source unit 120 or the center P1 of the lens 124 and the contact point P2 in the first direction or the x-axis direction.

The patterns 132-1 to 132-4 may be located at a point P3 at which the light 126 may reach the reflection unit 130. On the assumption that the position of the patterns 132-1 to 132-4 in the first direction or the x-axis direction is X, and the position of the patterns 132-1 to 132-4 in the y-axis direction is Y, the positions X and Y of the point P3 may be derived from Equations 1 and 2 as represented by Equations 3 and 4.

$$X = \left(\frac{\tan\theta\, 2 \times w - H}{\tan\theta\, 2 - \tan\theta\, 1}\right) \quad \text{[Equation 3]}$$

$$Y = -\tan(\theta 1)\frac{\tan\theta\, 2 \times w - H}{\tan\theta\, 2 - \tan\theta\, 1} + H \text{ or}$$

$$Y = -\tan(\theta 2)\frac{\tan\theta\, 2 \times w - H}{\tan\theta\, 2 - \tan\theta\, 1} + \tan(\theta 2) \times w \quad \text{[Equation 4]}$$

In Equations 3 and 4, X may indicate the distance between the contact point P2 and the point P3 of the patterns 132-1 to 132-4 in the first direction or the x-axis direction perpendicular to the optical axis LX, and Y may indicate the distance between the light source unit 120 or the center P1 of the lens 124 and the point P3 of the patterns 132-1 to 132-4 in the second direction or the y-axis direction parallel to the optical axis LX.

The angle of inclination θ2 in Equations 2 to 4 may be represented by Equation 5.

$$\theta 2 = 90° - \frac{a}{2} + k \times b \quad \text{[Equation 5]}$$

In Equation 5, a and b indicate a beam angle of light exiting from the light source unit 120 and the width of the beam angle, respectively, and k indicates a variable.

Figure 5:
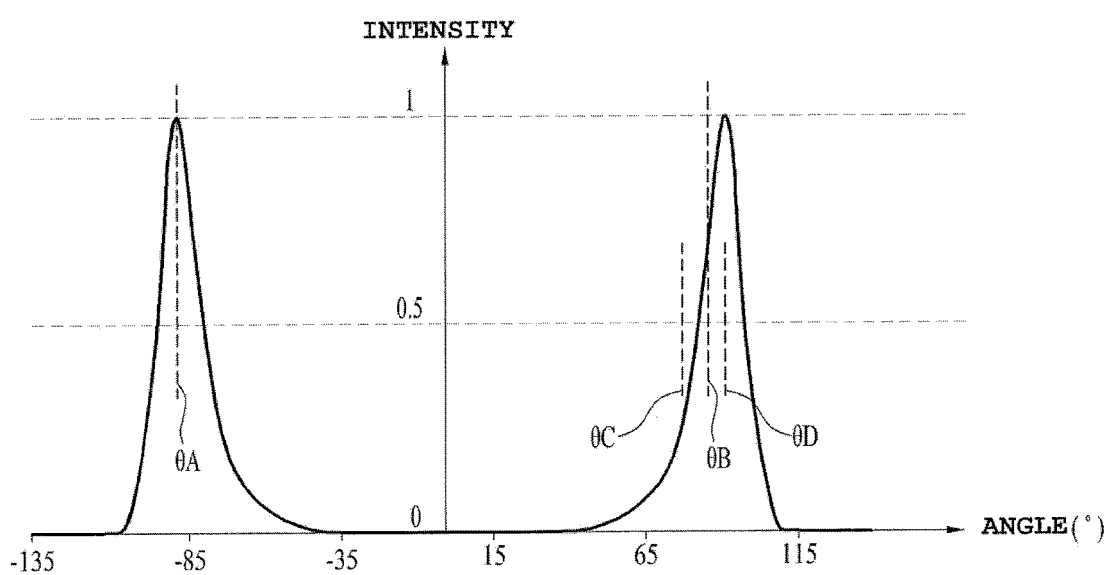
FIG. 5 is a graph of a beam angle and the width of the beam angle.

FIG. 5 is a graph of a beam angle and the width of the beam angle. In FIG. 5, a vertical axis indicates the normalized intensity of light, and a horizontal axis indicates angles.

In luminous intensity distribution of the light source unit 120, when the normalized intensity of light is 1, a beam angle a may be 180 degrees, which is a difference θB-θA between angles θB and θA. A width b of the beam angle a may be 14.1 degrees, which is a difference θD-θC between angles θC and θD. However, the disclosure is not limited thereto.

Figure 6A:
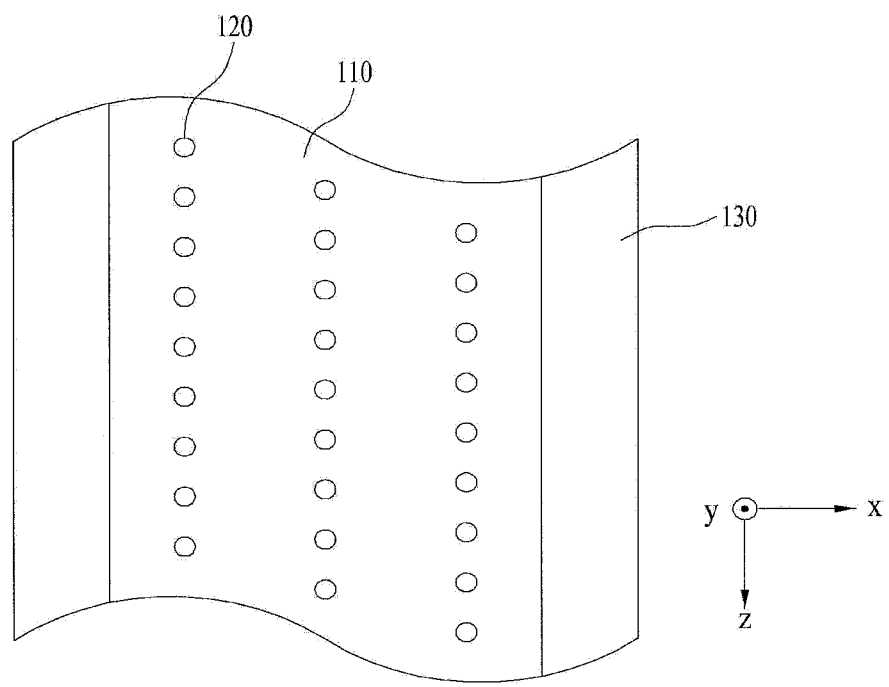
FIGS. 6A to 6C are a plan view, a plan photograph, and a local sectional view of a light emitting module according to a comparative example, respectively.
Figure 6B:
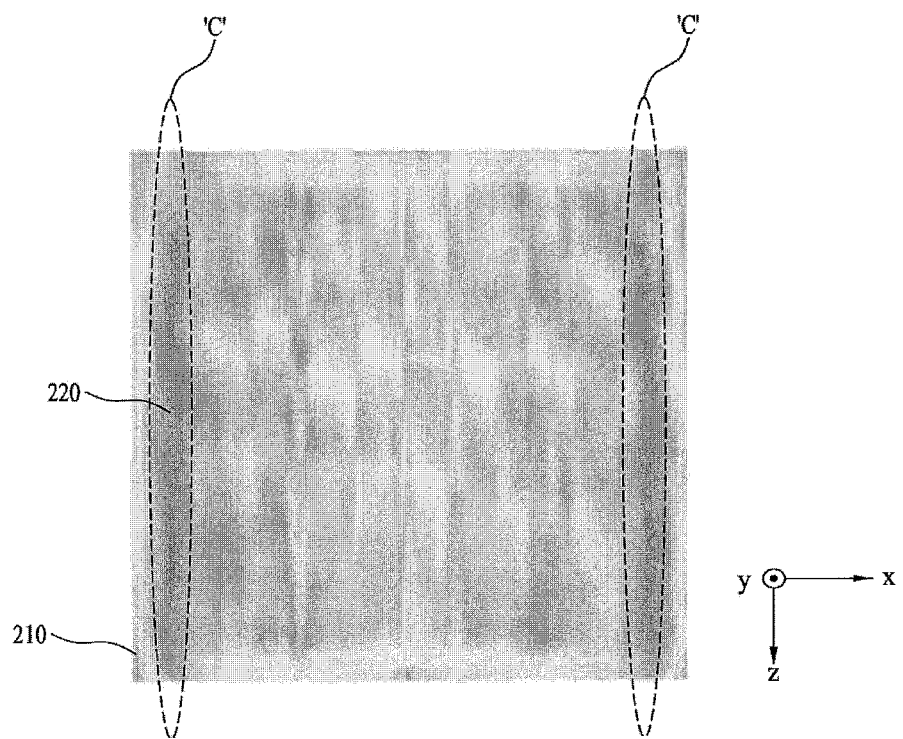
Figure 6C:
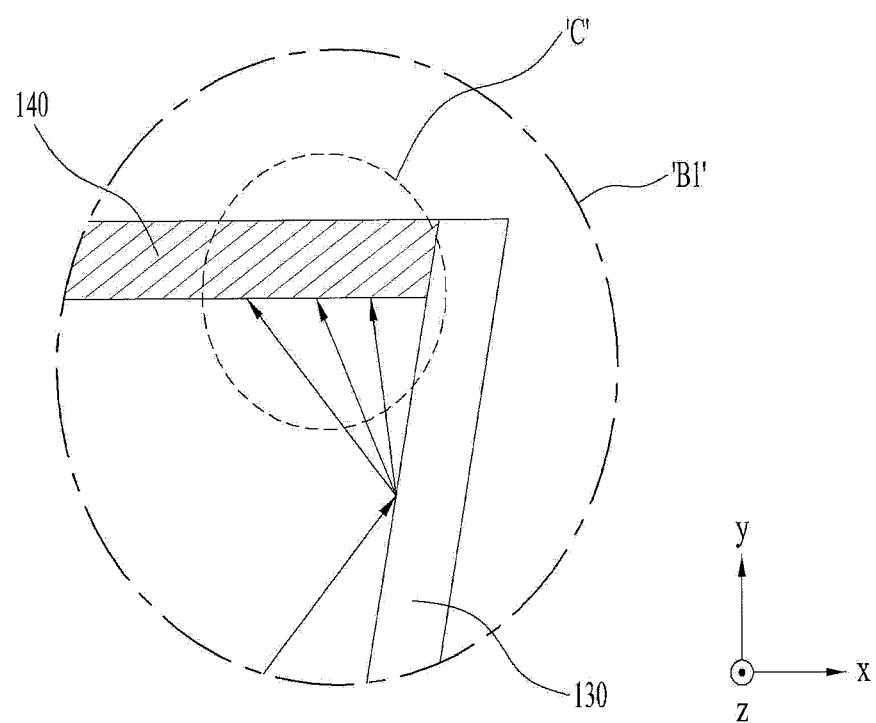
Figure 7A:
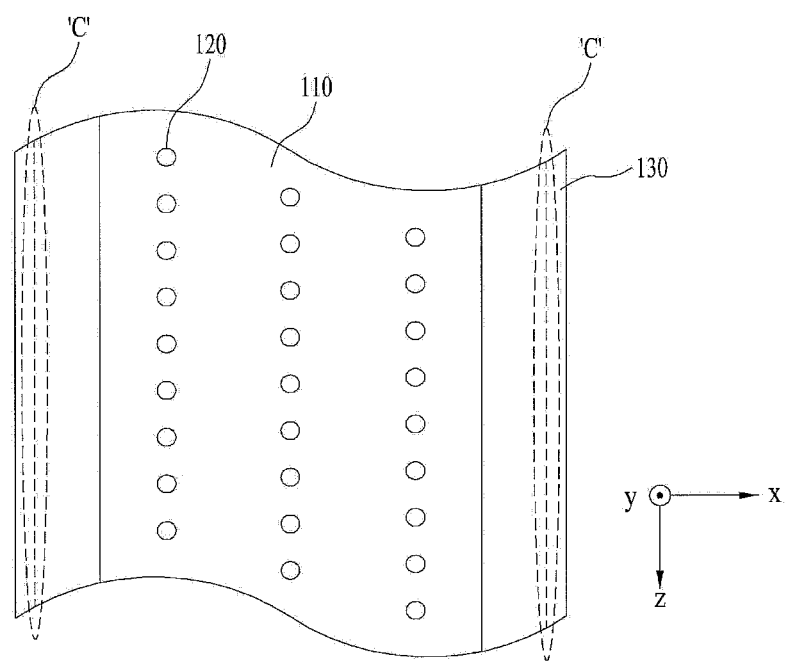
FIGS. 7A to 7C are a plan view, a plan photograph, and a sectional view of a light emitting module according to an embodiment, respectively.
Figure 7B:
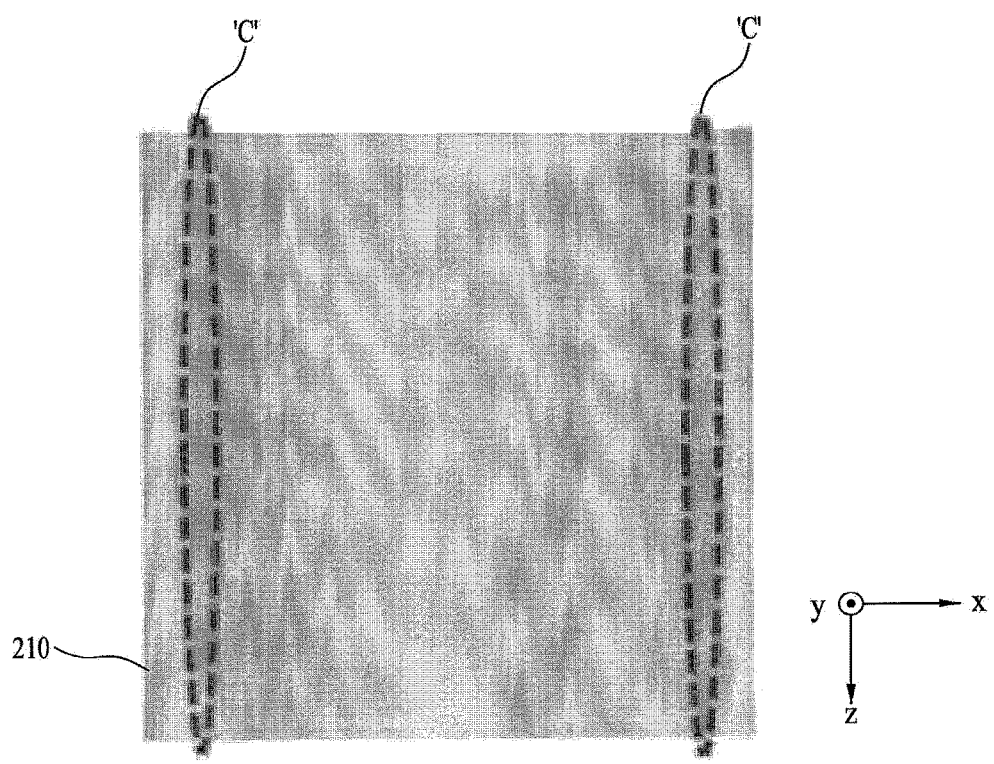
Figure 7C:
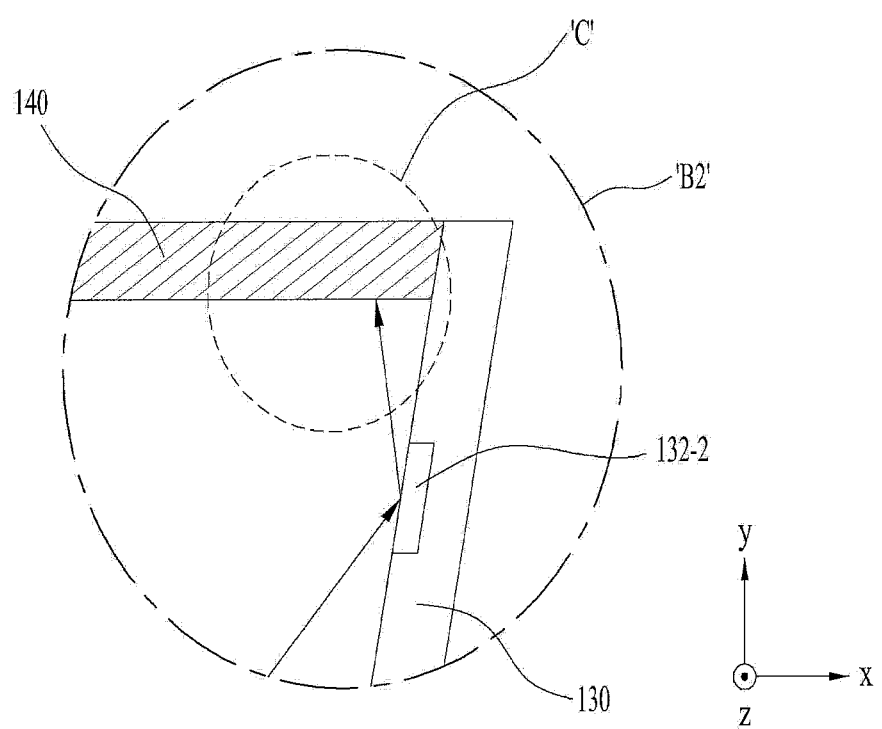

FIGS. 6A to 6C are a plan view, a plan photograph, and a local sectional view of a light emitting module according to a comparative example, respectively. FIGS. 7A to 7C are a plan view, a plan photograph, and a sectional view showing a light emitting module 100 according to an embodiment, respectively. FIGS. 6C and 7C are local sectional views of part 'B' shown in FIG. 2, in the comparative example and in the embodiment, respectively.

Referring to FIGS. 6A and 6C, none of the patterns 132-1 to 132-4 may be located at a reflection unit 130 of the light emitting module according to the comparative example. Referring to a sectional view B1 of FIG. 6C, light reflected by the reflection unit 130 may be scattered, and then exit through an optical member 140 in different directions. This is because an angle of inclination θ1 of the reflection unit 130 may be different from a beam angle of the light. As a result, as shown in FIG. 6B, a Mura phenomenon, or contrast spots, in which the difference between brightness 220 of a light exiting area C located at the edge of the optical member 140 and brightness of the central region of the optical member 140 is outstanding may occur. In the light emitting module according to the comparative example, as shown in the photograph of FIG. 6B, a bright line may be generated at the light exiting area C before light reaches a target illuminance surface TS shown in FIG. 2. The target illuminance surface TS may be a illuminance surface set or predetermined in order to design an optical module.

Referring to FIGS. 7A and 7C, patterns 132-1 to 132-4 may be located at a reflection unit 130 of the light emitting module 100 according to the embodiment. Referring to a sectional view B2 of FIG. 7C, the quantity of light reflected from positions at which the patterns 132-1 to 132-4 are located may be reduced so the light may exit through the optical member 140 without being scattered. Thus, as shown in FIG. 7B, the difference in contrast between the light exiting area C located at the edge of the optical member 140 and the central region of the optical member 140 may be less than that in the comparative example shown in FIG. 6B. That is, referring to FIG. 7B, in the light emitting module 100 according to the embodiment, the bright line may be removed from the light exiting area C, thereby improving uniformity in light and solving the Mura phenomenon.

If the patterns 132-1 to 132-4, which solve the Mura phenomenon, are formed at the reflection unit 130, it may be possible to reduce a thickness H of the light emitting module 100. In addition, the patterns 132-1 to 132-4 may be easily formed by punching. Thus, manufacturing may be simpler than when the patterns are printed on the reflection unit 130 using ink or when the material for a portion of the reflection unit 130 is changed, thereby preventing increased in manufacturing costs. It may also be possible to output light having the same intensity even when the number of the light source units 120 of the embodiment may be less than that of the comparative example, thereby reducing power consumption. Furthermore, it may be possible to reduce the size of a bezel 210 or to remove the bezel 210 according to the embodiment.

In addition, in Equation 5, k may be set or predetermined considering the characteristics of the light source units 120 or the characteristics between the light source units 120. For example, k may be set considering the distance between the light source units 120. If k is less than 0.35 or greater than 0.65, the difference in contrast between the edge and the center of the optical member 140, or the Mura phenomenon, may be serious. For this reason, k may be set to be 0.35 to 0.65. However, the disclosure is not limited thereto.

The light emitting module according to the previous embodiment may be applied to light emitting apparatuses, e.g., a lighting apparatus, a display apparatus, and an indicator. For example, the light emitting module may include a lamp or a streetlight. In particular, the light emitting module may be applied to a direct type backlight unit.

In a light emitting module and a light emitting apparatus according to embodiments, it may be possible to improve uniformity in light, to solve a Mura phenomenon, and to reduce the thickness thereof. In addition, patterns may be formed on a reflection unit by punching. As a result, manufacturing may be simpler than when the patterns are printed on the reflection unit using ink or when the material for a portion of the reflection unit is changed, thereby reducing manufacturing costs. It may also be possible to output light having the same intensity as that of a comparative example even when the number of light source units of the embodiments is less than that of a comparative example, thereby reducing power consumption. Furthermore, it may be possible to reduce the size of a bezel or to remove the bezel.

Embodiments provide a light emitting module and a light emitting apparatus that are capable of reducing the size of a bezel or removing the bezel with improved uniformity in light and low manufacturing cost.

In an embodiment, a light emitting module may include a board, at least one light source unit located on the board, an optical member located on the at least one light source unit, and a reflection unit located between the board and the optical member in an inclined state beside at least one light source unit, wherein the reflection unit may be located closer to the optical member than to the board and may include a pattern having lower reflectance than other constructions of the light emitting module.

For example, the at least one light source unit may include a light source located on the board and a lens located on the light source.

A beam angle of light emitted from the at least one light source unit may be different from an angle of inclination of the reflection unit on the basis of a horizontal surface in a direction perpendicular to an optical axis.

The pattern may have a shape of at least one band. The at least one band may include a plurality of bands arranged parallel to each other. The pattern may include a plurality of blind holes or through holes arranged in a dotted-line or solid-line shape. The distance between the blind holes or through holes arranged in the dotted-line shape may be less than the length of each of the blind holes or through holes.

For example, a position at which the pattern is formed may be defined as follows.

$$X = \left(\frac{\tan\theta\ 2 \times w - H}{\tan\theta\ 2 - \tan\theta\ 1}\right)$$

$$Y = -\tan(\theta 1)\frac{\tan\theta\ 2 \times w - H}{\tan\theta\ 2 - \tan\theta\ 1} + H \text{ or}$$

$$Y = -\tan(\theta 2)\frac{\tan\theta\ 2 \times w - H}{\tan\theta\ 2 - \tan\theta\ 1} + \tan(\theta 2) \times w$$

In the above equations, X may indicate a distance from a contact point between the optical member and the reflection unit to the position in a first direction perpendicular to an optical axis, Y may indicate a distance between the position and the at least one light source unit in a second direction parallel to the optical axis, θ1 may indicate an angle at which the reflection unit may be inclined with respect to a horizontal surface in the first direction, passing through the at least one light source unit, θ2 may indicate an angle at which light exiting from the at least light source unit may be inclined with respect to the horizontal surface, w may indicate a distance between the at least one light source unit and the contact point in the first direction, and H may indicate a distance between the at least one light source unit and the contact point in the second direction.

For example, θ2 may be defined as follows.

$$\theta 2 = 90° - \frac{a}{2} + k \times b$$

In the above equation, a and b may indicate a beam angle of light exiting from the at least one light source unit and a width of the beam angle, respectively, and k may indicate a variable. For example, k may be 0.35 to 0.65, and the width b of the beam angle a may be 14.1 degrees.

The pattern may be located along at least one selected from between a major axis and a minor axis of the reflection unit. The pattern may be located higher than the upper surface of the at least one light source unit. The pattern may be located symmetrically with respect to the at least one light source unit in a direction intersecting the optical axis.

The beam angle of light emitted from the at least one light source unit may be identical to the angle of inclination of the reflection unit on the basis of the horizontal surface in the direction perpendicular to the optical axis.

The pattern may be located asymmetrically with respect to the at least one light source unit in the direction intersecting the optical axis.

The at least one band comprises a plurality of bands arranged parallel to each other.

The width of the beam angle is 14.1 degrees.

The blind holes may be formed by punching.

The board may have an upper surface coated with a reflective material, and the reflection unit may include at least one selected from between a metal and a metal oxide.

In another embodiment, a light emitting apparatus may include the light emitting module.

It will be understood that when an element is referred to as being "on" or "under" another element, it can be directly on/under the element, and one or more intervening elements may also be present.

When an element is referred to as being "on" or "under", "under the element" as well as "on the element" can be included based on the element.

In addition, the relative terms "first," "second," "top," "bottom," etc. used herein may only be used to distinguish any entities or elements from each other without requiring or encompassing any physical or logical relationship between or order of the entities or elements.

An optical module 100 according to an embodiment disclosed herein is described using a Cartesian coordinate system (x, y, z) where an x-axis, an y-axis, and an z-axis are perpendicular to one another. However, other different coordinate systems may be used, and the disclosure is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module, comprising:
a board;
at least one light source unit provided on the board;
an optical member spaced apart from the at least one light source unit; and
a reflection unit provided between the board and the optical member in an inclined state beside the at least one light source unit,
wherein the reflection unit includes a pattern having lower reflectance than other constructions of the light emitting module, the pattern being located closer to the optical member than to the board, and
wherein a position at which the pattern is formed is defined as follows:

$$X = \left( \frac{\tan\theta\, 2 \times w - H}{\tan\theta\, 2 - \tan\theta\, 1} \right)$$

$$Y = -\tan(\theta 1) \frac{\tan\theta\, 2 \times w - H}{\tan\theta\, 2 - \tan\theta\, 1} + H \text{ or}$$

$$Y = -\tan(\theta 2) \frac{\tan\theta\, 2 \times w - H}{\tan\theta\, 2 - \tan\theta\, 1} + \tan(\theta 2) \times w$$

where X indicates a distance from a contact point between the optical member and the reflection unit to the position in a first direction perpendicular to an optical axis, Y indicates a distance between the position and the at least one light source unit in a second direction parallel to the optical axis, θ1 indicates an angle at which the reflection unit is inclined with respect to a horizontal surface in the first direction, passing through the at least one light source unit, θ2 indicates an angle at which light exiting from the at least one light source unit is inclined with respect to the horizontal surface, w indicates a distance between the at least one light source unit and the contact point in the first direction, and H indicates a distance between the at least one light source unit and the contact point in the second direction.

2. The light emitting module according to claim 1, wherein the at least one light source unit includes:
a light source provided on the board; and
a lens provided on the light source.

3. The light emitting module according to claim 1, wherein a beam angle of light emitted from the at least one light source unit is different from an angle of inclination of the reflection unit based on a horizontal surface in the first direction.

4. The light emitting module according to claim 1, wherein the pattern has a shape of at least one band.

5. The light emitting module according to claim 1, wherein θ2 is defined as follows:

$$\theta 2 = 90° - \frac{a}{2} + k \times b$$

where a and b indicate a beam angle of light exiting from the at least one light source unit and a width of the beam angle, respectively, and k indicates a variable.

6. The light emitting module according to claim 5, wherein k is 0.35 to 0.65.

7. The light emitting module according to claim 1, wherein the pattern is provided along at least one selected from a major axis and a minor axis of the reflection unit.

8. The light emitting module according to claim 1, wherein the pattern is located higher than an upper surface of the at least one light source unit.

9. The light emitting module according to claim 1, wherein the pattern is symmetrical with respect to the at least one light source unit in a direction that intersects an optical axis.

10. The light emitting module according to claim 1, wherein a beam angle of light emitted from the at least one light source unit is identical to an angle of inclination of the reflection unit on the basis of a horizontal surface in the first direction.

11. The light emitting module according to claim 1, wherein the pattern is asymmetrical with respect to the at least one light source unit in a direction that intersects an optical axis.

12. The light emitting module according to claim 4, wherein the at least one band includes a plurality of bands arranged parallel to each other.

13. The light emitting module according to claim 1, wherein the blind holes are formed by punching.

14. The light emitting module according to claim 5, wherein the width b of the beam angle a is 14.1 degrees.

15. The light emitting module according to claim 1, wherein the board includes an upper surface coated with a reflective material.

16. The light emitting module according to claim 1, wherein the reflection unit is made of a metal or an oxide-metal.

17. The light emitting module according to claim 1, wherein the reflection unit is inclined less than 90° with respect to the board.

18. A light emitting apparatus comprising:
a light emitting module, the light emitting module including:
 a board;
 at least one light source unit provided on the board;
 an optical member spaced apart from the at least one light source unit; and
 a reflection unit provided between the board and the optical member in an inclined state beside the at least one light source unit, wherein the reflection unit is made of a metal or an oxide-metal,
wherein the reflection unit includes a pattern having lower reflectance than other constructions of the light emitting module and the pattern being formed directly into the reflection unit, the pattern being located closer to the optical member than to the board, wherein the pattern includes a plurality of blind holes or through holes arranged in a dotted-line on an inner face of the reflection unit adjacent to the optical member, and wherein the dotted line extends in a first direction parallel to the board, and
wherein a position at which the pattern is formed is defined as follows:

$$X = \left(\frac{\tan\theta\, 2 \times w - H}{\tan\theta\, 2 - \tan\theta\, 1}\right)$$

$$Y = -\tan(\theta 1)\frac{\tan\theta\, 2 \times w - H}{\tan\theta\, 2 - \tan\theta\, 1} + H \text{ or}$$

$$Y = -\tan(\theta 2)\frac{\tan\theta\, 2 \times w - H}{\tan\theta\, 2 - \tan\theta\, 1} + \tan(\theta 2) \times w$$

where X indicates a distance from a contact point between the optical member and the reflection unit to the position in a second direction perpendicular to an optical axis, Y indicates a distance between the position and the at least one light source unit in a third direction parallel to the optical axis, θ1 indicates an angle at which the reflection unit is inclined with respect to a horizontal surface in the second direction, passing through the at least one light source unit, θ2 indicates an angle at which light exiting from the at least one light source unit is inclined with respect to the horizontal surface, w indicates a distance between the at least one light source unit and the contact point in the second direction, and H indicates a distance between the at least one light source unit and the contact point in the third direction.

19. The light emitting apparatus according to claim 18, wherein the light emitting apparatus is one of a lamp, a display, a streetlight, a backlight, and a vehicle indicator.

20. The light emitting module according to claim 18, wherein a distance between each of the plurality of blind holes or through holes arranged in the dotted-line is less than a length of each of the blind holes or through holes in the plane view.

* * * * *